United States Patent [19]
Weber

[11] Patent Number: 5,689,137
[45] Date of Patent: Nov. 18, 1997

[54] METHOD FOR TRANSFER MOLDING STANDARD ELECTRONIC PACKAGES AND APPARATUS FORMED THEREBY

[75] Inventor: Patrick O. Weber, San Jose, Calif.

[73] Assignee: Hestia Technologies, Inc., Sunnyvale, Calif.

[21] Appl. No.: 543,762

[22] Filed: Oct. 16, 1995

[51] Int. Cl.$^6$ .......................... H01L 23/02; H01L 23/495
[52] U.S. Cl. .................. 257/679; 257/667; 257/693; 257/787; 437/214; 437/219; 361/737; 264/272.17
[58] Field of Search .................................. 257/667, 679, 257/787, 922, 693; 361/737; 437/214, 219; 264/272.11, 272.17

[56] References Cited

U.S. PATENT DOCUMENTS

| | | | |
|---|---|---|---|
| 3,838,094 | 9/1974 | Sporck | 260/37 EP |
| 4,043,027 | 8/1977 | Birchler et al. | 29/588 |
| 4,460,537 | 7/1984 | Heinle | 264/272.17 |
| 4,859,722 | 8/1989 | Shiobara et al. | 523/433 |
| 5,132,778 | 7/1992 | Juskey et al. | 357/72 |
| 5,166,864 | 11/1992 | Chitwood et al. | 361/386 |
| 5,173,840 | 12/1992 | Kodai et al. | 361/395 |
| 5,244,840 | 9/1993 | Kodai et al. | 437/214 |

OTHER PUBLICATIONS

Zbranek, Jr. "PCMCIA Process Development", Circuits Assembly (Mar. 1995) pp. 46–50.
Markstein, "Effective Shielding Defeats EMI", Electronic Packaging & Production, (Feb. 1995) pp. 76–80.
Anderson, *PCMCIA System Architecture* (1994) pp. 21–28, Mindshare, Inc., Richardson, TX.
Freiberger, "PCMCIA Testing and Final Assembly" Circuits Assembly (Mar. 1995) pp. 42–45.
Spraylat Corporation, sales brochure, Mt. Vernon, NY.
Methode Electronics, Inc. sales brochure, Chicago, IL.
Berg Electronics, sales brochure (Aug. 1993).
Minico, sales brochure (1991).

*Primary Examiner*—Tom Thomas
*Assistant Examiner*—David Ostrowski
*Attorney, Agent, or Firm*—Burns, Doane, Swecker & Mathis, L.L.P.

[57] ABSTRACT

A method for transfer molding a standard electronic package and an apparatus resulting from such method. A seal is formed between a portion of the mold platens of the mold and a portion of a printed circuit board adjacent to electrical contacts along at least one side of the printed circuit board. After the apparatus is removed from the mold, a protective cap is placed over the electrical contacts.

21 Claims, 8 Drawing Sheets

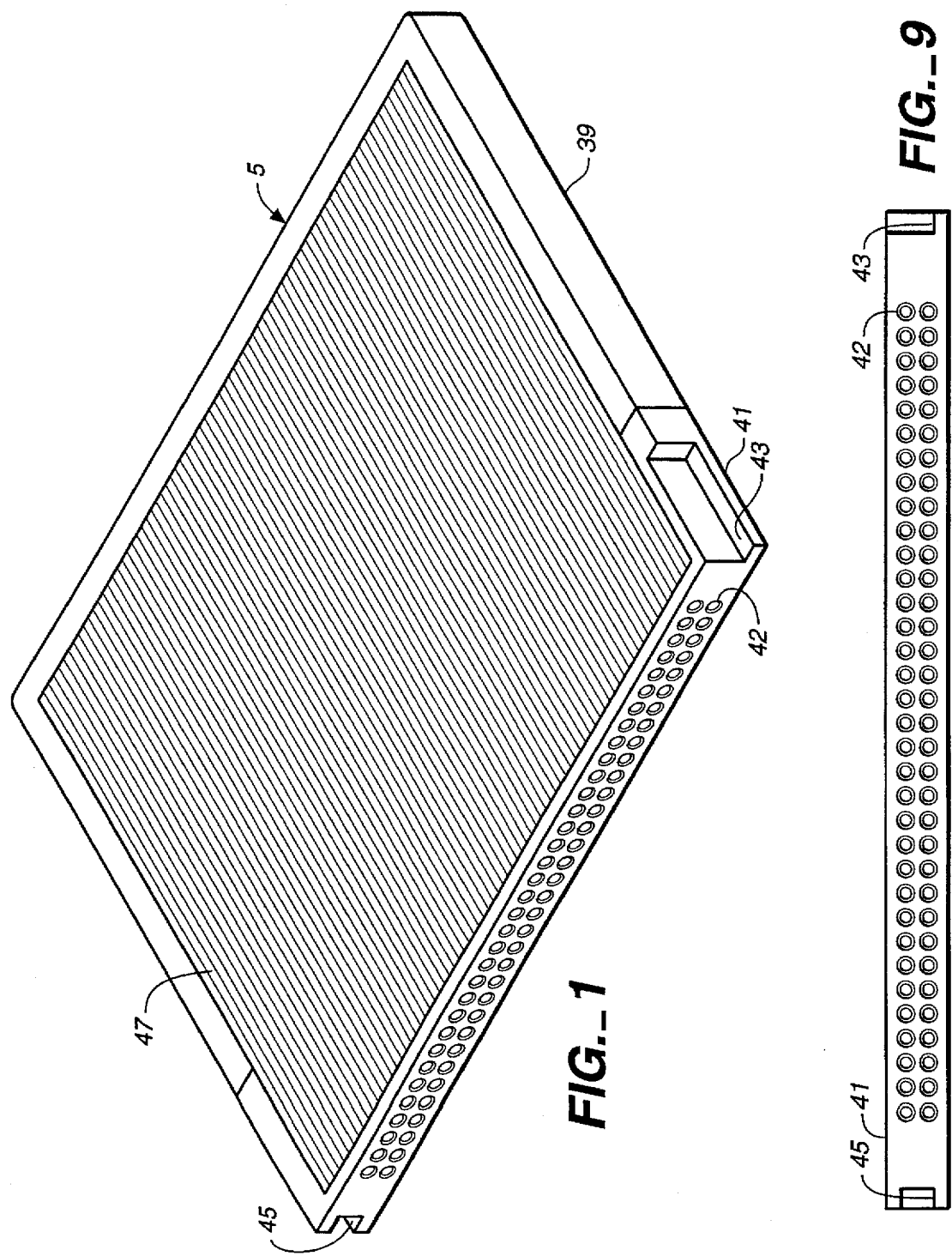

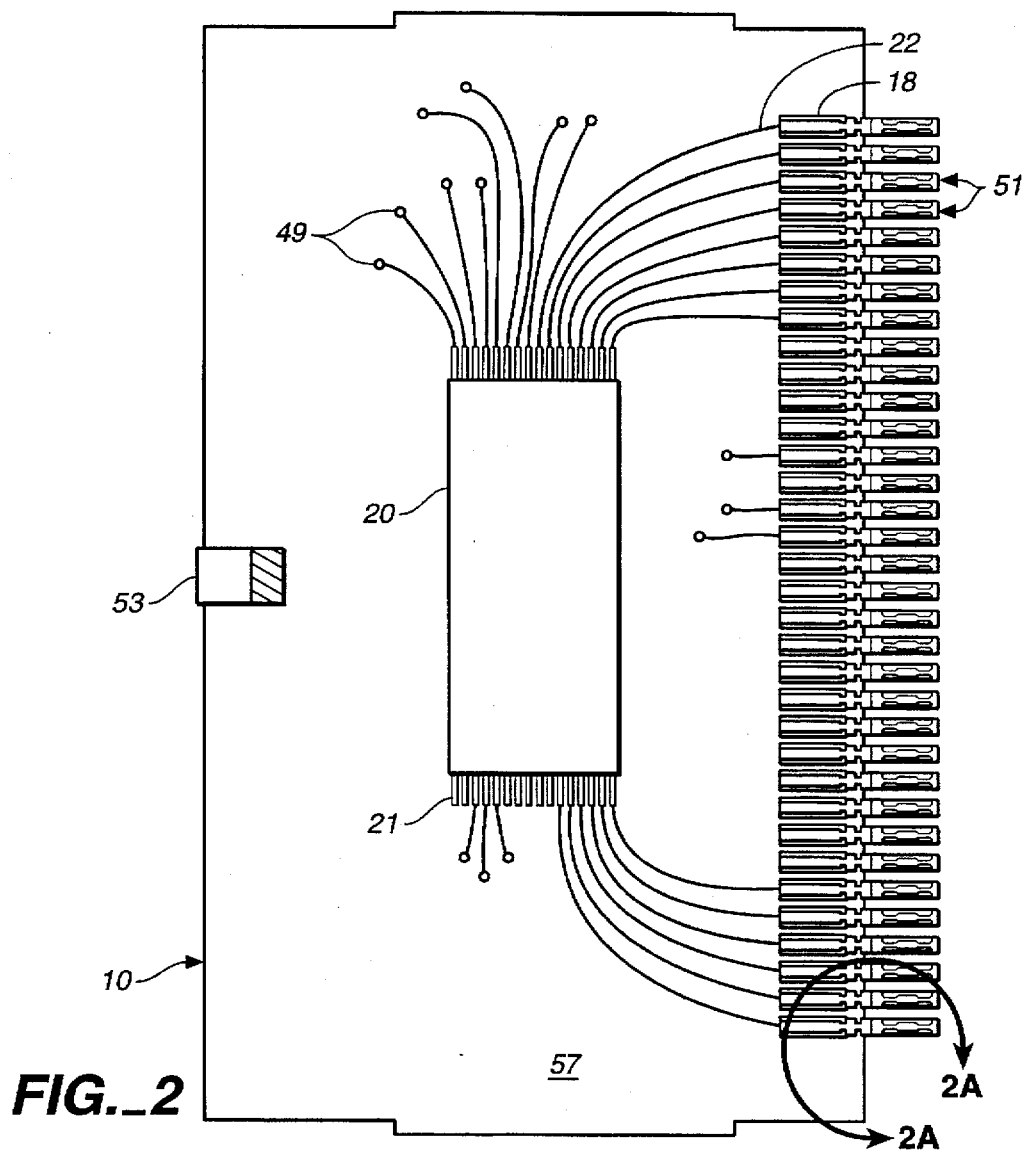
FIG._2
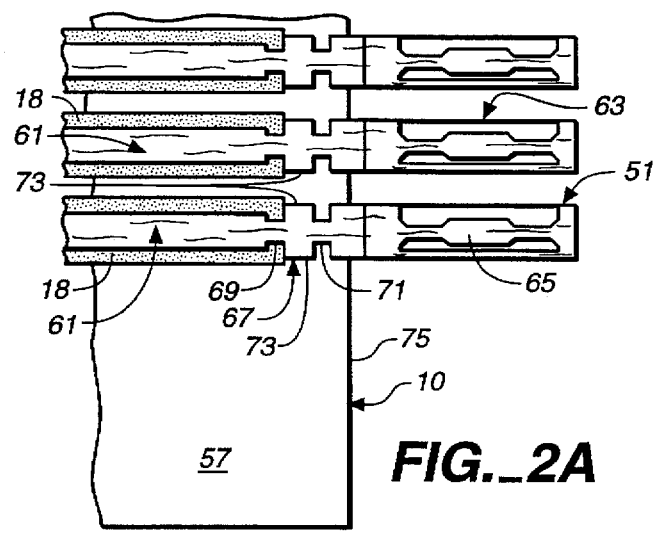
FIG._2A

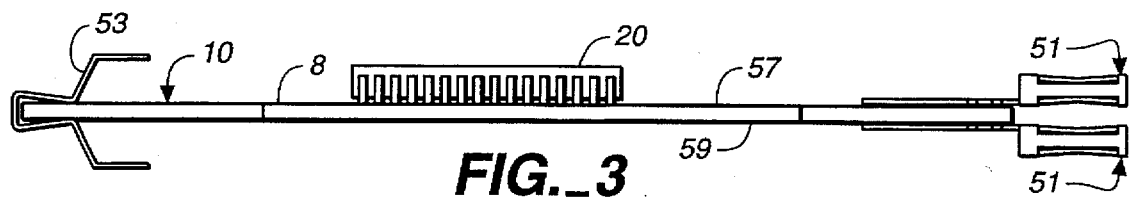
FIG._3
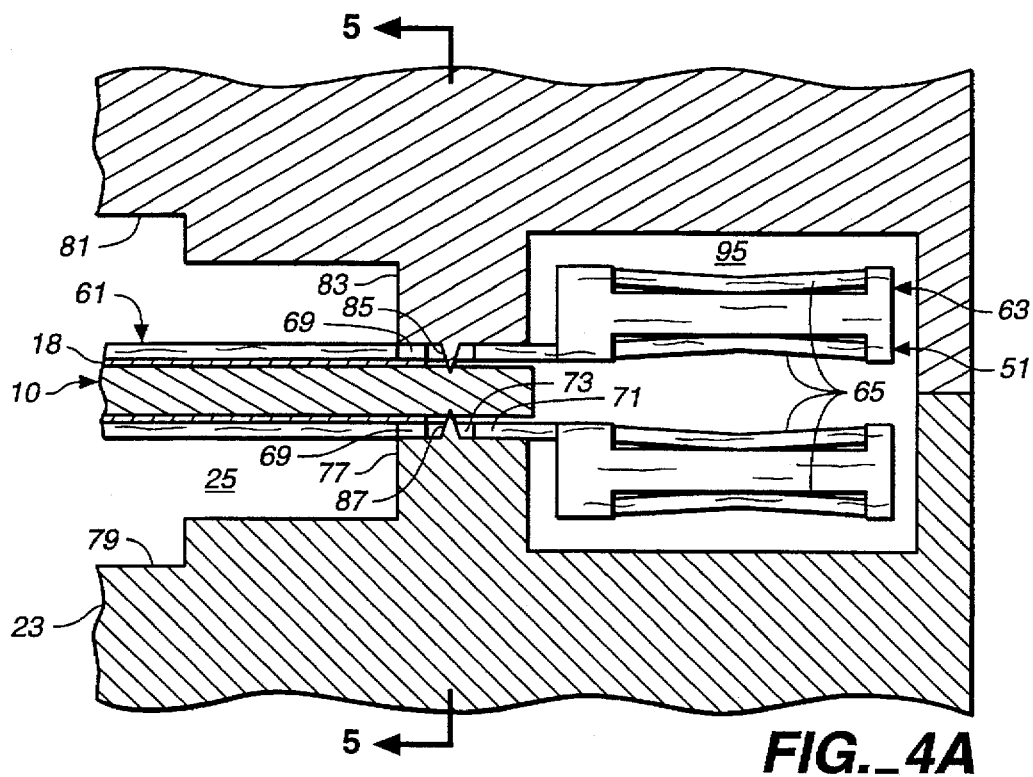
FIG._4A
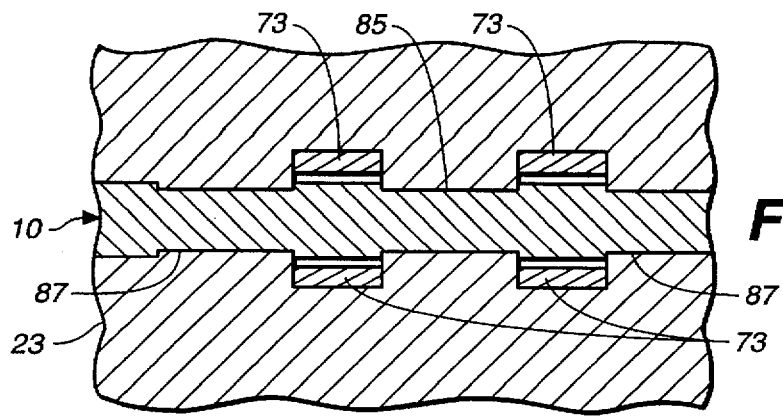
FIG._5

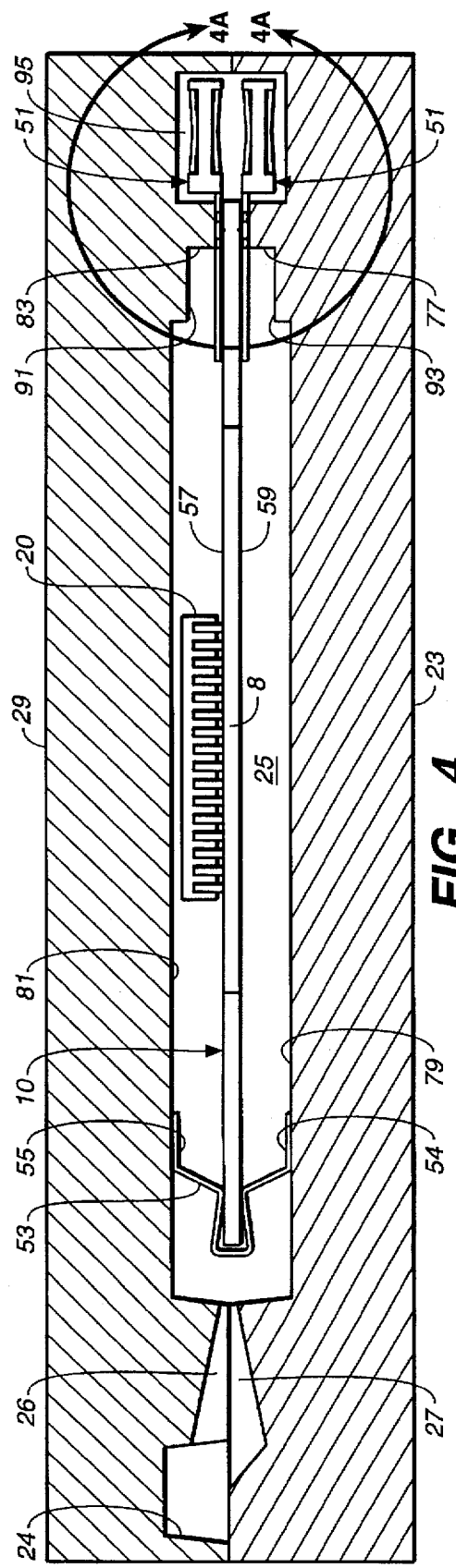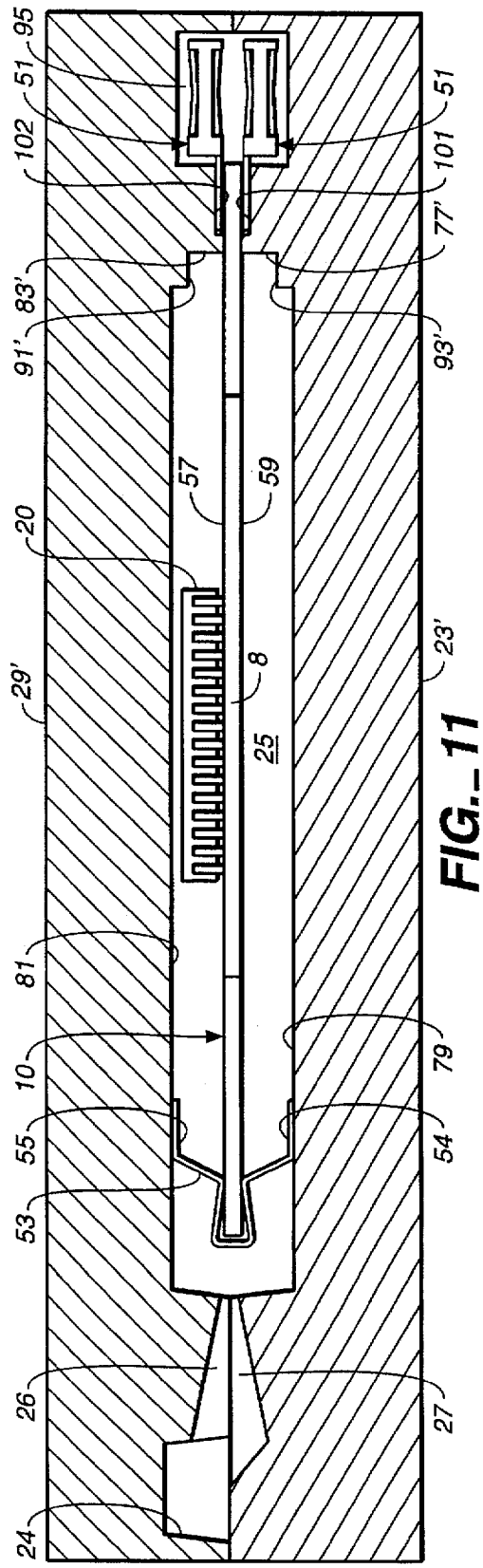
FIG._4
FIG._11

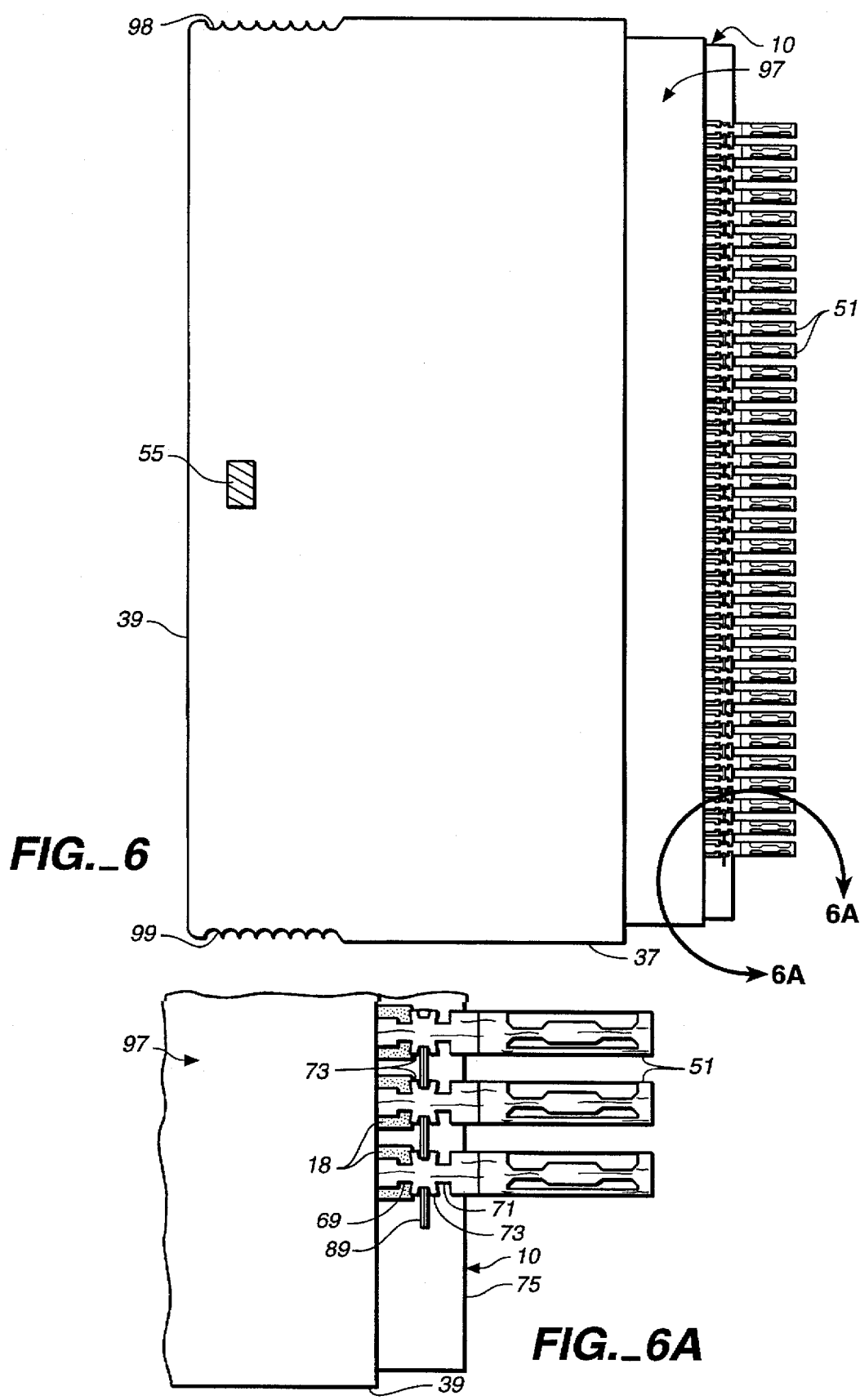

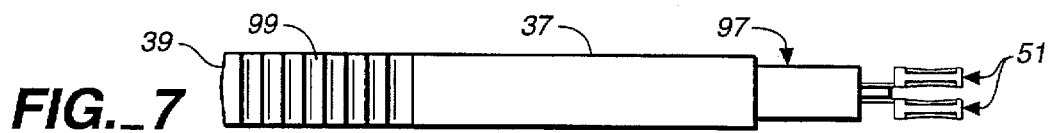
FIG._7
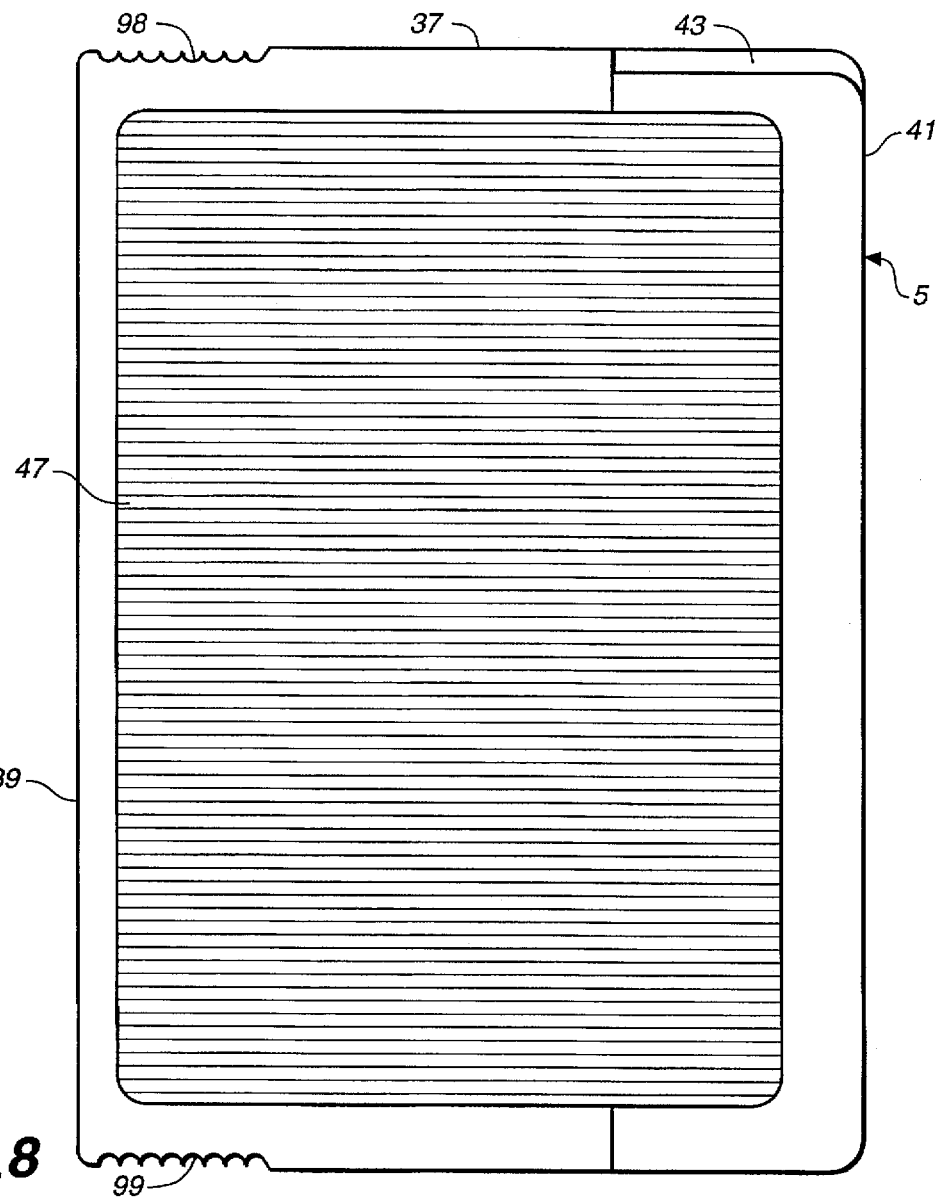
FIG._8
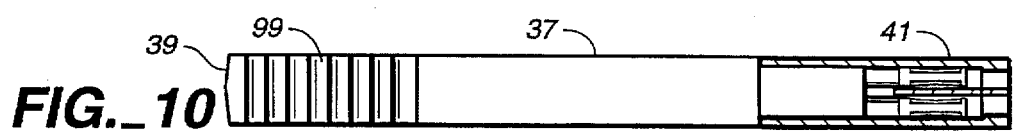
FIG._10

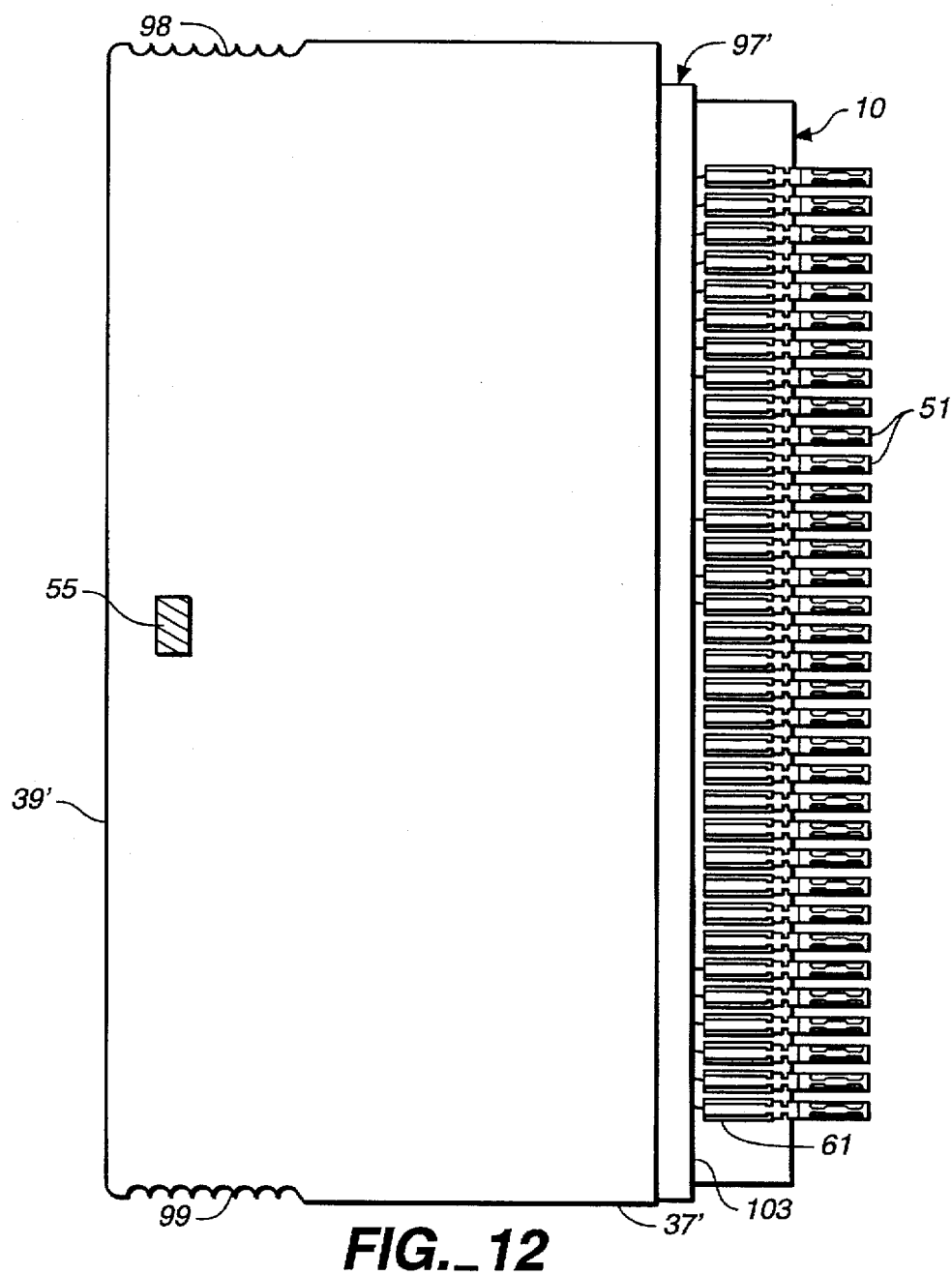
FIG._12
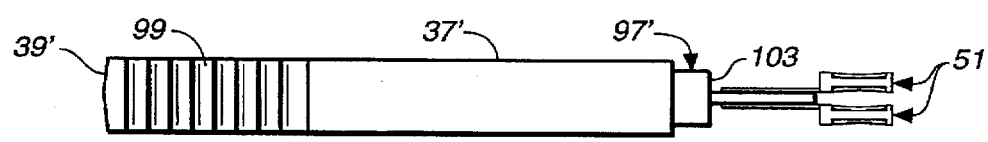
FIG._13

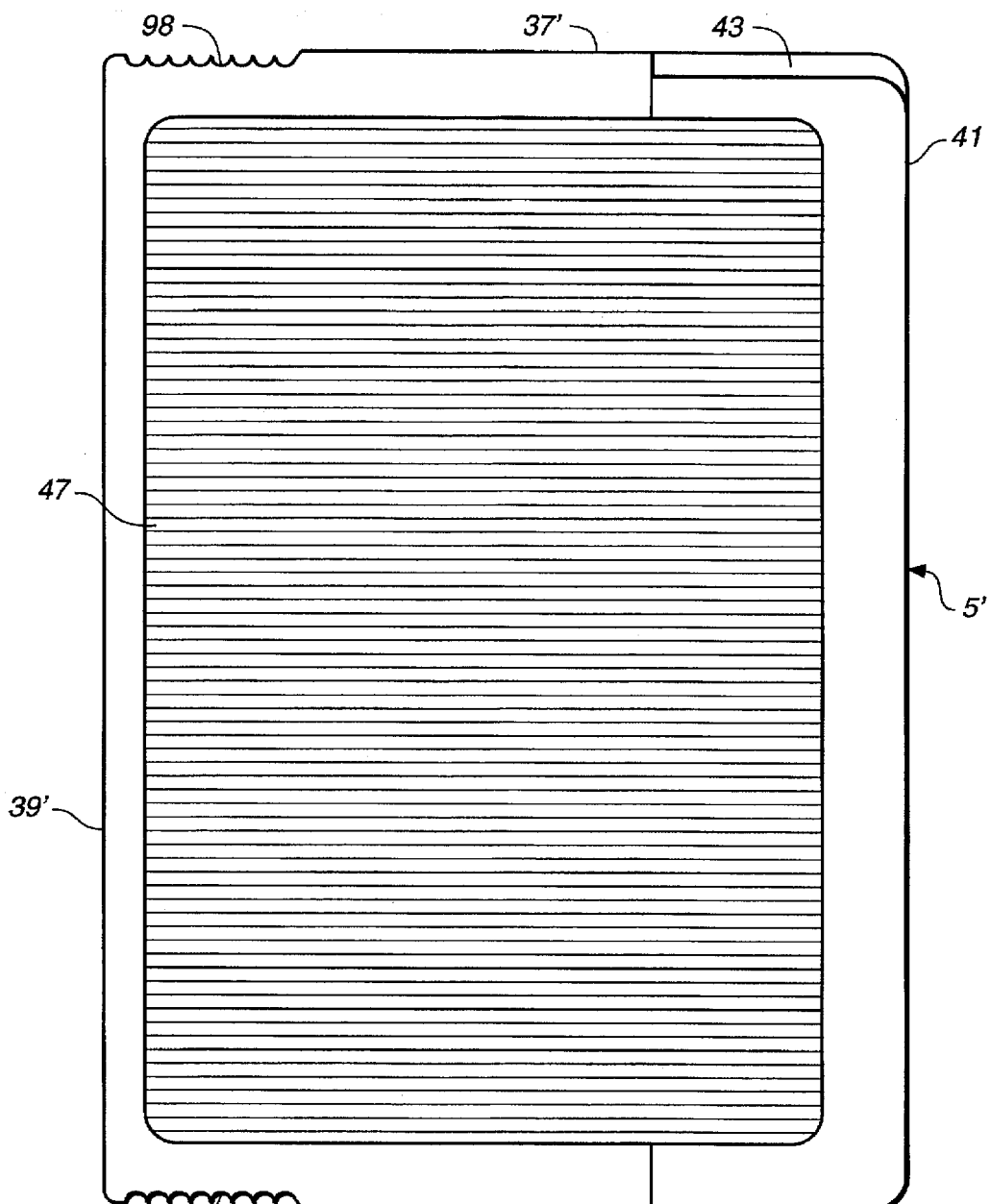
FIG._14
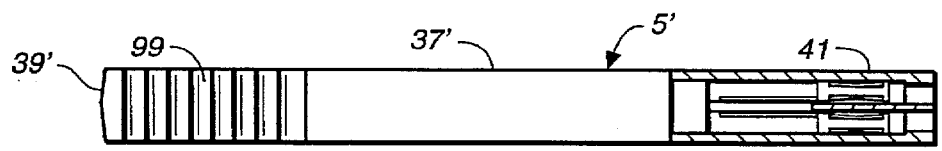
FIG._15

METHOD FOR TRANSFER MOLDING STANDARD ELECTRONIC PACKAGES AND APPARATUS FORMED THEREBY

BACKGROUND OF THE INVENTION

1. Field of the Invention

This invention relates in general to improved techniques for encapsulating objects, such as electronic devices and components and, more particularly, to an improved method and mold for the transfer molding of standard electronic packages, such as PCMCIA standard packages (i.e., PC cards).

2. Discussion of Prior Art

The Personal Computer Memory Card International Association (PCMCIA) is a standards body composed of more than 300 member companies. PCMCIA has developed standard sized electronic packages for personal computers cards (i.e., PC cards). A PC card is standardized in size for use in personal computers, personal communicators, and other electronic devices. PC cards are used to provide additional memory, storage, communication and input/output (I/O) capabilities, especially for portable systems.

PCMCIA standards describe the physical requirements, electrical specifications and software architecture for PC cards. The standards define three physical sized cards: Type I, Type II and Type III. The thickness is the only difference between the three types. The thicknesses for Type I, Type II and Type III are 3.3, 5.0 and 10.5 millimeters, respectively. All three types use a standard 68 position connector for connecting to the computer or other device.

There are various methods of producing each of the different sizes of PC cards. Each method consists essentially of producing a printed circuit board (i.e., PC board or substrate) with electronic components thereon. Attaching a frame around the PC board and applying covers (or lids) on either side of the PC board. If the PC card uses the single 68 pin connector, the PC board simply slips into the frame, and the connector locks in place. If the PC card also has a "back end" connector. Typically, the "back end" connector is attached to the frame and then attached to the PC board using a soldering process.

A ground clip is typically attached either to the side of the frame to ground the PC card to the computer's internal ground or is attached to the PC board. Two metallized covers are attached to the PC board-frame assembly (one on each side) to protect the electronic components therein.

The most common cover type is the adhesive-backed metal lid. A press applies both heat and pressure to attach the cover to the frame. The covers must be hand-aligned on the assembly and placed into the press at about 120° C. for 20 seconds under pressure. The unit is then allowed to cool in the press to prevent cold flow or lifting of the cover from the frame. The total process time for this assembly is typically 180 seconds. Typically, springs are place between the lids and the PC board to prevent electromagnetic interference (EMI) problems.

Another type of lid is the staple lid, which is a cover with metal tabs for protruding through the frame. The tabs are typically crimped around the frame. Assembly is simple but requires a die and press. The two covers are hand-aligned on the frame. The assembly is the placed into the press, pressure applied and the crimps made. The attachment process is around 60 seconds but the tooling cost is higher than the adhesive-backed metal lids because of the cost of the die set.

Another type of lid is the injection-molded cover. This method involves injection-molding a frame around the edges of a top lid and injection-molding a frame around the edges of a bottom lid, thus eliminating the frame as a separate component. The two lid-frame assemblies on placed on opposite sides of the PC board and ultrasonically welded together. Process time is around 30 seconds but the ultrasonic welding step is costly.

The final type is a "snap together" configuration. The covers are simply snapped together over the rails of the frame around the PC board. Ground tabs are incorporated into the covers that are bent in such a manner as to contact pads on the PC board without the need for soldering. The process time is around 20 seconds.

There is a continuing need in the art for a cost-effective method for producing standard electronic packages meeting the requirements of the PCMCIA standards.

SUMMARY OF THE INVENTION

A substrate (i.e., PC board) with an electronic component, a plurality of electrical contacts and metallized paths connecting the component to the electrical contacts is prepared with commonly known techniques. The substrate is placed between two mold platens in a mold cavity such that the electrical contacts are located outside of the mold cavity. The mold cavity is sized to meet the physical limitations of either a Type I, Type II or Type III PCMCIA standard. The mold platens are closed together such that the mold platens form a seal with each side of the substrate adjacent to the electrical contacts. The substrate is then encapsulated with a transfer-molding process. After the encapsulated substrate has been removed from the mold cavity, a protective cap is placed over the electrical contacts and a conductive element is placed on the outside surface of the encapsulated substrate to prevent EMI and electrostatic discharge (ESD) problems.

In accordance with one embodiment of the present invention, there is provided a method for transfer molding a standard electronic package, comprising the steps of providing a substrate having an electronic component and a plurality of electrical contacts along a side of the substrate, each of the electrical contacts having an attachment portion connected to the electronic component by metallized paths, providing mold platens that form a mold cavity placing the substrate in the mold cavity between the mold platens such that the electrical contacts are located outside of the mold cavity, the mold platens forming a seal with the substrate adjacent to the plurality of electrical contacts, and encapsulating the standard electronic package by transferring fluid molding compound into the mold cavity to encapsulate the electronic component, and at least a pan of the metallized paths and the substrate.

In accordance with another embodiment of the present invention, there is provided a transfer-molded standard electronic package, comprising a substrate having an electronic component and a plurality of electrical contacts along a side of the substrate, each of the electrical contacts having an attachment portion connected to the electronic component by metallized paths, and a transfer-molded encapsulant covering the substrate, the electronic component, and at least a part of the metallized paths such that the electrical contacts extend beyond the encapsulant and the encapsulant forms a seal with the substrate.

BRIEF DESCRIPTION OF THE DRAWING

FIG. 1 is a perspective view of a standard electronic package in accordance with one embodiment of the present invention.

FIG. 2 is a top plan view of a substrate having an electronic component, metallized paths and electrical contacts in accordance with one embodiment of the present invention.

FIG. 2A is an enlarged view of the area 2A of FIG. 2.

FIG. 3 is a left side elevational view of the substrate of FIG. 2.

FIG. 4 is a left side elevational view, partially in cross-section, of the substrate of FIG. 2 in a mold in accordance with one embodiment of the present invention.

FIG. 4A is an enlarged view of the area 4A of FIG. 4.

FIG. 5 is a sectional view taken along line 5—5 of FIG. 4A.

FIG. 6 is a top plan view of the standard electronic package of FIG. 4 after being removed from the mold in accordance with one embodiment of the present invention.

FIG. 6A is an enlarged view of the area 6A of FIG. 6.

FIG. 7 is a left side elevational view of the standard electronic package of FIG. 6.

FIG. 8 is a top plan view of a transfer-molded standard electronic package in accordance with one embodiment of the present invention.

FIG. 9 is a from elevational view of the transfer-molded standard electronic package of FIG. 8.

FIG. 10 is a left side elevational view, partially in cross-section, of the transfer-molded standard electronic package of FIG. 8.

FIG. 11 is a left side elevational view, partially in cross-section, of the substrate of FIG. 2 in a mold in accordance with another embodiment of the present invention.

FIG. 12 is a top plan view of the standard electronic package of FIG. 11 after being removed from the mold in accordance with another embodiment of the present invention.

FIG. 13 is a left side elevational view of the standard electronic package of FIG. 12.

FIG. 14 is a top plan view of a transfer-molded standard electronic package in accordance with another embodiment of the present invention.

FIG. 15 is a left side elevational view, partially in cross-section, of the transfer-molded standard electronic package of FIG. 14.

DETAILED DESCRIPTION OF THE PREFERRED EMBODIMENTS

Standard electronic package 5 (i.e., a PC card) is made by the transfer molding methods disclosed herein to be in compliance with the PCMCIA standards. The electronic package 5 is comprised of a transfer-molded body 39 around a printed circuit board substrate. A connector cap 41 is attached to the front of the electronic package 5 to enclose a standard sixty-eight electrical contact connector attached to one side of the printed circuit board substrate. Openings 42 in the connector cap 41 are pin receptors aligned with the electrical contacts attached to the substrate (discussed in more detail below). The connector cap 41 has the standard keyways 43 and 45 on each end in accordance with the PCMCIA standards to ensure proper mating and orientation with a personal computer socket in which the package 5 is inserted.

A conductive element 47 is attached to each of the top and bottom surfaces of the package 5. The conductive element 47 is an EMI and ESD protective coating or lid which prevents electromagnetic radiation from being emitted from the package and prevents electrostatic discharge into the package 5. Conductive element 47 can be a variety of materials such as: a conductive polymer (e.g., epoxy, elastomer, etc.) screen-printed on the surface of the transfer-molded body, conductive paper attached as a label to the surface, a label attached with conductive adhesive, metallized non-woven fabric attached to the surface, conventional metal foil or plates set in an offset in the surface, conductive tape, metal-based paints, etc.

With reference to FIGS. 2, 2A and 3, the starting element for the standard package 5 in accordance with the present invention is a laminated substrate 10. Substrate 10 is a conventional printed wiring board (PWB or printed circuit board (PCB)), typically of the multi-layer variety (e.g., four or six layers). However, the substrate can be a single layer substrate up to any number of layers that fit within the physical limitations of the PCMCIA standards after molding. The substrate 10 includes a plurality of plated vias 49 extending through the substrate 10 which interconnect the multiple layers. Electronic device 20 having an integrated circuit (not shown) is attached to the upper surface 57 of the substrate 10. Multiple electronic devices or components can be attached to the laminated substrate depending on the type of PC card being produced (e.g., fax/modem, memory, etc.) A plurality of electrical contacts 51 (i.e., sixty-eight standard electrical contacts) are attached along one side of the substrate 10.

In one embodiment, the integrated circuit of electronic device 20 is attached to the plurality of bond fingers 18 through the plurality of bonding feet 21 attached to metallized paths 22. Metallized paths 22 can extend through the thickness of the substrate and along layers in the substrate. The plurality of electrical contacts 51 located along at least one side of the substrate are also attached to the bond fingers 18. Typically, thirty-four electrical contacts 51 are attached to the upper surface 57 along one side of the substrate 10 and thirty-four electrical contacts 51 are attached to the lower surface 59 along the side of the substrate 10. A spacer 53 is attached to the substrate 10 on the side opposite the electrical contacts 51. The function of spacer 53 will be discussed below in connection with the molding process.

FIG. 2A is a close-up view of the area 2A of FIG. 2 showing a few of the electrical contacts 51 attached to the bond fingers 18 on the upper surface 57 of the substrate 10. In one embodiment, each of the electrical contacts 51 has an attachment portion 61 for attaching to the bond fingers 18, a mating portion 63 for mating with corresponding pins (not shown) located in the personal computer socket in which the standard electronic package 5 is to be inserted, and a sealing portion 67. The mating portion 63 extends beyond the edge 75 of the substrate 10 in order to receive the connector cap 41 and to extend outside of the mold cavity to be described below. The mating portion 63 can be folded into a C-shape as shown with contact elements 65 deflected inward (see FIG. 4A) to make good electrical contact with the pins (not shown) when received in the mating portion 63 or the mating portion can be circular or other configurations generally known in the connector art.

The attachment portion 61 of each electrical contact 51 is soldered to the bond fingers 18 (FIG. 2A). Interposed between the attachment portion 61 and the mating portion 63 of the electrical contact 51 is the sealing portion 67. The sealing portion 67 is comprised of narrowed sections 69 and 71 with extensions 73 located between the narrowed sections on each electrical contact. The narrowed sections 69, 71 and extensions 73 are set back in one embodiment from the edge 75 of the substrate 10 so that a portion of the mating portion 63 is supported by the substrate 10 until the connector cap 41 is placed over the electrical contacts 51.

The following are a couple of examples of embodiments of the transfer molding process in accordance with the present invention. Plastic encapsulation of the substrate 10 is accomplished by a transfer molding process. In the transfer molding process, as one of ordinary skill in the art will recognize, a large number of substrates are placed in an open multicavity mold, one substrate in each cavity. When the mold is closed the two mold portions, usually called "platens" or "halves", come together surrounding the substrates. The multiple cavities in the mold are connected by a tree-like array of channels (i.e., runners) to a central reservoir (i.e., pot) from which the plastic is fed. Usually, "gates" (i.e., constricted channels) are placed just at the entrance to each cavity to control the flow and injection velocity of the plastic into the cavity, and to permit easier removal of the plastic material which has solidified in the runners from the finished part.

Typically in the transfer molding process, powdered or pelletized plastic is placed in the central reservoir and compressed by a ram. The mold and reservoir are usually hot. The combination of heat and pressure causes the plastic to liquify and flow through the runner-tree and gates into the individual mold cavities, where it subsequently hardens. The mold halves are then separated and the encapsulated parts are removed and trimmed of excess plastic left in the runners and the gates.

As used herein the words "upper platen" and "lower platen" or "upper mold platen" and "lower mold platen" refer to the two separable portions of the mold used to define the enclosed mold cavity in which molding is to occur. The words "upper" and "lower" are used for ease of description and do not imply a required orientation in space, since the molds may be readily designed to operate in either top transfer (ram on top) or bottom transfer (ram on bottom) configurations without affecting their basic function. Each of the figures relating to the mold platens only show a single mold cavity and device in the transfer mold for ease of description. As discussed above, ordinarily a plurality of such cavities exist so that a relatively large number of devices can be simultaneously molded. Well known mold features such as ejector pins which facilitate removal of the finished part(s) are omitted for clarity. Those of ordinary skill in the art will recognize that such a feature and/or others may be used in practice.

In one embodiment, lower platen 23 is placed in a mold press (not shown) and substrate 10 is placed in lower platen 23 (FIGS. 4, 4A and 5). Lower surface 59 of substrate 10 contacts the top of portion 77 of lower platen 23 to support the side of the substrate having the electrical contacts 51 thereon. Spacer 53 in one embodiment is clipped over the edge of the substrate 10 such that it extends above and below the substrate. Spacer 53 preferably is a metallic element (or metallic coated element). In addition, spacer 53 is attached to the internal ground of the substrate 10 (e.g., by being located on a metallized pad). When the substrate 10 is placed in the lower platen 23, the end 54 of spacer 53 contacts the inside surface 79 of the lower platen 23. Spacer 53 supports the side of the substrate 10 opposite of the side having the electrical contacts 51 therealong.

Upper platen 29 is aligned over lower platen 23 so that mold cavity 25 is formed surrounding almost all of substrate 10 (i.e., the electrical contacts and the portion of the substrate located between portions 77 and 83 are outside of the mold cavity). FIG. 4 shows the substrate located between mold platens 23 and 29, which are employed in the transfer molding operation. When upper platen 29 is placed over the substrate 10, the end 55 of the spacer 53 contacts the inside surface 81 of the upper platen 29. Upper surface 57 of substrate 10 contacts the bottom of portion 83 of upper platen 29. The portions 77 and 83 form a seal with the substrate 10 adjacent to the plurality of electrical contacts 51.

In one embodiment as can be seen better in FIGS. 4A, 5 and 6A, the portions 77 and 83 form a seal with extensions 73 on each of the sealing portions 67 of the electrical contacts 51 and the substrate 10. Projections (i.e., barbs or teeth) 85 extend down from the bottom of portion 83 and projections 87 extend up from the top of portion 77 of the mold platens. The projections 85 and 87 are spaced between the electrical contacts 51 along the side of the substrate 10 as can be seen in FIG. 5. In one embodiment, the projections 85 and 87 are of sufficient length to deform (i.e., cut through the thickness of) the extensions 73 on each of the electrical contacts 51 and extend into the substrate 10. The projections 85 and 87 leave indentations 89 in the substrate 10. The projections 85 and 87 cut through only a portion of each of the extensions 73 in which they contact. As the projections 85 and 87 cut through the extensions 73, the narrowed sections 69 and 71 allow the extensions to deform thus assuming a butterfly shape (FIG. 6A).

In another embodiment utilizing the projections 85 and 87, the projections do not extend into the substrate 10, they merely contact the surface or at least come within 1 mil of the surface of the substrate 10 because fluid molding compound will not pass through openings less than 1 mil. In still yet another embodiment, the projections are blunt tipped and deform (i.e, compress or smash) the extensions 73 instead of cutting through them. The projections 85 and 87 in any of the embodiments help to form a seal with the substrate 10 and electrical contacts 51 to prevent fluid encapsulating material from escaping from the mold cavity 25 during the molding process.

The step 91 in upper platen 29 and the step 93 in the lower platen 23 create an attachment area 97 for connector cap 41. Protective cavity 95 can be provided to prevent molding compound (i.e., fluid encapsulating material) from coming in contact with the electrical contacts 51 and/or to prevent the electrical contacts 51 from being damaged during the molding process. In another embodiment, the mold platens terminate at the end of the portions 77 and 83 that contact the substrate 10 so that the electrical contacts are exposed without protection.

In the transfer molding operation, a predetermined volume of fluid (heated) molding compound at least sufficient to fill the net volume of mold cavity 25 is forced into runner 24 at approximately 500 psi. The molding compound is typically a thermoset plastic. The molding compound can be any of a number of transfer molding materials known to one of ordinary skill in the art, including but not limited to those disclosed in Sporck, U.S. Pat. No. 3,838,094, Shiobara et al., U.S. Pat. No. 4,859,722, and Jusky et al., U.S. Pat. No. 5,132,778, all of which are incorporated herein by reference in their entirety.

The transfer molding process using the thermoset plastic is preferred over an injection molding process using a thermoplastic. The transfer molding process is performed at temperatures between 150°–200° C. which does not harm the electronic components or reflow the soldered connections. Contrarily, the injection molding process is performed at temperatures above 300° C. which can harm electronic components and reflow the soldered connections.

The fluid molding compound passes into mold cavity 25 through upper gate 26 and lower gate 27. The molding compound flows over upper surface 57 and under lower surface 59 of substrate 10 and around edges 8 of substrate 10 to encapsulate the substrate and its components. It is important that the velocity at which the liquid molding compound is injected into the mold cavities be controlled so as not to exceed a maximum injection velocity. The limit on the maximum injection velocity is required in order to avoid forming voids in the molding compound, having the rapidly moving molding compound damage fragile elements of the electronic device, or causing the substrate 10 to flutter up and down in the mold cavity 25. Spacer 53 contacting the upper and lower mold platens helps to stabilize the substrate 10 during the molding process. The maximum injection velocity may be readily determined by experiment. It is also important that the injection molding time be less than the solidification time. This second requirement imposes a lower limit upon the injection velocity.

In the transfer molding art, it is a good rule of thumb that the fluid molding compound will not flow into a gap or recess smaller than about 0.025 mm. Thus, vents can be provided having a diameter of about 0.01 mm to relieve air pressure within the mold while precluding the flow of molding compound therethrough.

The transfer molded body 39 is shown in FIGS. 6 and 7. The molded package typically starts to cure in the mold. Then, the package is removed from the mold and cured or cross-linked at about 175° C. for four hours. Curing is not necessary for all applications, some molding compounds do not need post mold curing. Likewise, mold curing may not be required for the particular product being molded. If the components are not mounted directly to the substrates and/or already have a molded body around them, then no mold cure is required. Whereas if the components are mounted directly to the substrate and/or without a molded body already around them, then mold curing is typically performed. The molding compound hardens into encapsulant 37 that surrounds the top surface, bottom surface and sides of substrate 10 except in the area adjacent to the electrical contacts that was sealed off by the mold platens. Ridged portions 98 and 99 can be molded into the encapsulant 37 to facilitate grasping and inserting or removing the PC card 5 from a personal computer.

After the molded body 39 is hardened, connector cap 41 is slid over the electrical contacts 51 and attached to the attachment area 97 by a friction press fit, adhesive or locking mechanism to protect the electrical contacts. Conductive element 47 as discussed above is then applied to each side of the molded body 39 overlapping a portion of the connector cap 41 (FIGS. 7–10). The ends 54 and 55 of spacer 53 are exposed on the top and bottom of the encapsulant 37 as a result of being in contact with the surfaces of the top and bottom mold platens (FIG. 6). Therefore, when the conductive element 47 is applied to the molded body, the spacer provides an electrical connection to the interior ground of the substrate. If a conductive epoxy is used for the conductive element 47, it can be cured in an oven at 150° C. for 1 hour or snap cured in a belt furnace at 200° C. for 15 minutes after being applied to the encapsulant 37.

FIGS. 11–15 illustrate another embodiment of the present invention in which the sealing portion of the mold cavity that is adjacent to the electrical contacts is located set back from the distal end of the attachment portion 61 of each of the electrical contacts. In this way, the top of the lower portion 77' of the lower platen 23' and the bottom of the portion 83' of the upper platen 29' form a seal with the substrate 10, in particular with the substrate surface and metallized paths 22. The top of the lower portion 77' and bottom of the portion 83' have a step 101, 102 respectively in each of them to accommodate the attachment portion 61 of each of the electrical contacts 51 (FIG. 11 ).

In this embodiment, the top of the lower portion 77' and the bottom of the portion '83 are level across the length of the electrical contact attachment portions without need for the projections 85 and 87. As a result of the sealing portion of the mold cavity 25 being farther back from the edge 75 of the substrate in this embodiment, the steps 91' and 93' are shorter than the steps 91 and 93 described previously and a gap is left between the edge 103 of the encapsulant 37' and the attachment portions 61 of each electrical contacts 51. The substrate 10 in this embodiment is molded and cured (if necessary) in the same manner as described above. The attachment area 97' of this embodiment is slightly smaller than the attachment area 97 but the connector cap 41 is attached in the same manner. The encapsulant 37', molded body 39' and PC card 5' are then completed in the manner described above with respect to the previous embodiment.

The foregoing has described the principles, preferred embodiments and modes of operation of the present invention. However, the invention should not be construed as being limited to the particular embodiments discussed. Thus, the above-described embodiments should be regarded as illustrative rather than restrictive, and it should be appreciated that variations may be made in those embodiments by workers skilled in the art without departing from the scope of the present invention as defined by the following claims. For example, as one of ordinary skill in the art will recognize, a plurality of electrical contacts can be attached to the side opposite of the electrical contacts 51 of the substrate to produce an external connector on the PC card as is commonly used in I/O cards. The spacer 53 as well as the gates 26 and 27 can be moved to another side of the substrate and a protective cavity similar to protective cavity 95 can be provided to protect the contacts of the external connector. In the alternative, the mold platens could terminate prior to the contacts of the external connector. The substrate of this type of embodiment would be stabilized by being held on two sides between the two mold platens, thus allowing the spacer 53 to be less substantial in strength and merely act as a connection between the outer conductive elements and the interior ground.

The invention claimed is:

1. A method for transfer molding a standard electronic package, comprising the steps of:

providing a substrate having an electronic component on a surface of the substrate and a plurality of electrical contacts along a side of the substrate, each of the electrical contacts having an attachment portion connected to the electronic component by metallized paths;

providing mold platens that form a mold cavity;

placing the substrate in the mold cavity between the mold platens such that the electrical contacts are located outside of the mold cavity, the mold platens forming a seal with the substrate adjacent to the plurality of electrical contacts such that the electrical contacts extend beyond the mold cavity formed by the mold platens; and encapsulating the standard electronic package by transferring fluid molding compound into the mold cavity to encapsulate the electronic component, and at least a part of the metallized paths and the substrate.

2. The method of claim 1, further comprising:

forming a seal with the attachment portion of the electrical contacts and the substrate.

3. The method of claim 1, further comprising:

forming a seal with the metallized paths and the substrate.

4. The method of claim 1, further comprising:

placing a protective cap over the electrical contacts.

5. The method of claim 1, further comprising:

curing the molding compound.

6. The method of claim 1, further comprising:

placing a conductive element on an outside surface of the standard electronic package to prevent electrostatic damage to the electronic component.

7. The method of claim 6, further comprising:

placing a spacer on a second side of the substrate, the spacer contacting at least one interior surface of the mold cavity to stabilize the substrate during the encapsulating step.

8. The method of claim 7, further comprising:

connecting the spacer to the conductive element.

9. The method of claim 1, further comprising:

adhering a conductive polymer on an outside surface of the standard electronic package to prevent electrostatic damage to the electronic component.

10. The method of claim 1, further comprising:

providing extensions extending from the attachment portion of each of the electrical contacts; and deforming the extensions with the mold platens to form the seal.

11. The method of claim 1, further comprising:

providing extensions extending from the attachment portion of each of the electrical contacts; and cutting into the extensions with projections from the mold platens to form the seal.

12. A transfer-molded standard electronic package, comprising:

a substrate having an electronic component on a surface of the substrate and a plurality of electrical contacts along a side of the substrate, each of the electrical contacts having an attachment portion connected to the electronic component by metallized paths; and a transfer-molded encapsulant covering the substrate, the electronic component, and at least a part of the metallized paths such that the electrical contacts and at least a part of each of the attachment portions extend beyond the surface of the encapsulant and the encapsulant forms a seal with the substrate and the attachment portion of the electrical contacts.

13. The transfer-molded standard electronic package of claim 12, further comprising:

a protective cap covering the electrical contacts that extend beyond the encapsulant.

14. The transfer-molded standard electronic package of claim 12, further comprising:

a conductive element on an outside surface of the standard electronic package to prevent electrostatic damage to the electronic component.

15. The transfer-molded standard electronic package of claim 14 wherein the conductive element is a screen-printed conductive polymer.

16. The transfer-molded standard electronic package of claim 14, further comprising:

a ground; and a spacer on a second side of the substrate connecting the conductive element to the ground.

17. The transfer-molded standard electronic package of claim 16 wherein the spacer extends generally perpendicular from a top surface and a bottom surface of the substrate.

18. The transfer-molded standard electronic package of claim 12, further comprising:

extensions extending from the attachment portion of the electrical contacts forming a part of the seal.

19. The transfer-molded standard electronic package of claim 12, further comprising:

deformed extensions extending generally perpendicular from the attachment portion of the electrical contacts forming a part of the seal.

20. A transfer-molded standard electronic package, comprising:

a substrate having an electronic component on a surface of the substrate and a plurality of electrical contacts along a side of the substrate, each of the electrical contacts having an attachment portion connected to the electronic component by metallized paths; and a transfer-molded encapsulant covering the substrate, the electronic component, and at least a part of the metallized paths such that the electrical contacts and at least a part of the metallized paths protrude beyond the encapsulant and the encapsulant forms a seal with the substrate and at least a part of the metallized paths.

21. A transfer-molded standard electronic package, comprising:

a substrate having an electronic component on a surface of the substrate and a plurality of electrical contacts along a side of the substrate, each of the electrical contacts having a sealing portion and an attachment portion connected to the electronic component by metallized paths; and a transfer-molded encapsulant covering the substrate, the electronic component, and at least a part of the metallized paths such that the electrical contacts and at least a part of the sealing portion of each of the electrical contacts protrude beyond the encapsulant and the encapsulant forms a seal with the substrate and the sealing portion of each of the electrical contacts.

* * * * *